(12) United States Patent
Kim et al.

(10) Patent No.: US 7,016,558 B2
(45) Date of Patent: Mar. 21, 2006

(54) INTEGRATED OPTICAL DEVICE AND FABRICATING METHOD THEREOF

(75) Inventors: Young-Hyun Kim, Suwon-si (KR); In Kim, Suwon-si (KR); Sang-Moon Lee, Suwon-si (KR); Byung-Ok Jeon, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 66 days.

(21) Appl. No.: 10/792,621

(22) Filed: Mar. 3, 2004

(65) Prior Publication Data

US 2005/0036729 A1    Feb. 17, 2005

(30) Foreign Application Priority Data

Aug. 13, 2003  (KR) .................. 10-2003-0056181

(51) Int. Cl.
*G02B 6/12* (2006.01)
(52) U.S. Cl. .................. 385/14; 385/8; 385/9
(58) Field of Classification Search .................. None
See application file for complete search history.

(56) References Cited

U.S. PATENT DOCUMENTS

| 5,717,710 A | * | 2/1998 | Miyazaki et al. | ........ 372/50.11 |
| 5,978,402 A | * | 11/1999 | Matsumoto et al. | ....... 372/50.1 |
| 5,991,322 A | * | 11/1999 | Takiguchi et al. | ....... 372/50.11 |
| 2003/0194193 A1 | * | 10/2003 | Masuda | ...................... 385/131 |
| 2004/0048406 A1 | * | 3/2004 | Ikeda et al. | .................... 438/29 |

* cited by examiner

*Primary Examiner*—Kaveh Cyrus Kianni
(74) *Attorney, Agent, or Firm*—Cha & Reiter, L.L.C.

(57) ABSTRACT

An integrated optical device having at least two optical devices integrated therein and a method of fabricating the integrated optical device are provided. To fabricate an integrated optical device having optically connected and electrically isolated first and second optical devices on a substrate of a first conductive type, an active layer and a clad layer of a second conductive type are first formed in a mesa structure on the substrate, an SI clad layer is then formed on the substrate surrounding the clad layer of the second conductive type and the active layer, and finally first and second conductive layers are formed into trenches by diffusing a dopant of the second conductive type into the SI clad layer in areas corresponding to the first and second optical devices.

5 Claims, 7 Drawing Sheets

INTEGRATED OPTICAL DEVICE AND FABRICATING METHOD THEREOF

CLAIM OF PRIORITY

This application claims priority under 35 U.S.C. § 119 to an application entitled "Integrated Optical Device and Fabricating Method Thereof," filed in the Korean Intellectual Property Office on Aug. 13, 2003 and assigned Serial No. 2003-56181, the contents of which are incorporated herein by reference.

BACKGROUND OF THE INVENTION

1. Field of the Invention

The present invention generally relates to an integrated optical device having at least two optical devices integrated therein and a method of fabricating the integrated optical device, and in particular, to an integrated optical device in which optical devices are easily isolated electrically from each other and a method of fabricating the integrated optical device.

2. Description of the Related Art

For ultra high-speed optical signal transmission at 10 Gbps or higher, a wavelength band around a central wavelength 1550 nm is usually adopted as it experiences less optical loss in the fiber. An electro-absorption optical modulator is typically used in combination with a DFB LD (Distributed-Feedback Laser Diode) to fabricate an optical transmission system. However, in the case of a laser combined with the electro-absorption optical modulator, that is, an electro-absorption modulated laser (EML) is used, it is not effective in the long-distance transmission due to its low optical output. Therefore, to increase optical output, integration of an SOA (Semiconductor Optical Amplifier) has been proposed.

In an integrated device, electrical isolation between a DFB LD and an electro-absorption optical modulator (or electrical isolation) and optical isolation between an SOA and the electro-absorption optical modulator or between the SOA and the DFB LD is a significant factor which determines the level of performance.

FIG. 1 illustrates the structure of a conventional PBH (Planarized Buried Hetero-structure) integrated optical device, and FIG. 2 illustrates the structure of an EMBH (Etched Mesa Buried Hetero-structure) integrated optical device.

Referring to FIG. 1, a PBH integrated optical device 100 comprises a first optical device 110, a second optical device 120, and an electrical isolation area 130 provided therebetween Material layers of the optical devices 110 and 120 are formed on a substrate 101 and a light waveguide 102. The light waveguide 102 is preferably surrounded by a clad layer 103. An electrode for flowing current is provided in each of the first and second optical devices 110 and 120.

To fabricate the PBH integrated optical device 100, an active layer and the p-clad layer 103 are grown on the n-substrate 101. After the light waveguide 102 is formed into the shape of a mesa by etching the active layer and the p-clad layer 103, an SI (Semi-Insulating) clad layer 104 is formed around the light waveguide 102, and a $p^+$-clad layer 105 is grown on the overall substrate 101. Subsequently, the electrical isolation area 130 is formed between the first and second optical devices 110 and 120 over the light waveguide 102 for allowing the light to pass between the optical devices 110 and 120, thus electrically isolating the optical devices from each other. The formation of the electrical isolation area 130 is typically carried out by changing the property of the $p^+$-clad layer 105 through ion implantation, or by etching the $p^+$-clad layer 105.

The ion implantation has some drawbacks. First, it is accompanied by one or more photolithography processes which tend to provide a semiconductor crystalline structure with injected ions. Also, the manufacturing equipments required in the ion plantation are expensive. The etching requires photolithography, and excessive etching tend to damage the light waveguide and yields unstable throughput. Furthermore, since the $p^+$-clad layer is formed over a wide area, an additional etching is needed to reduce the resulting electrostatic capacity.

Referring to FIG. 2, an EMBH integrated optical device 200 comprises a first optical device 210, a second optical device 220, and an electrical isolation area 230 between them. To fabricate the EMBH integrated optical device 200, an active layer, a p-clad layer 203, and a $p^+$-clad layer 204 are formed on an n-substrate 201. A light waveguide 202 is formed in the shape of a mesa by etching them. An SI clad layer 205 is filled around the light waveguide 202. Since the $p^+$-clad layer 203 is positioned over the light waveguide 202, the EMBH integrated optical device has a reduced electrostatic capacity, which obviates the need for etching an unnecessary portion of the $p^+$-clad layer.

Similar to the PBH integrated optical device, the optical devices 200 are connected by the $p^+$-clad layer in the EMBH integrated optical device. Therefore, they need to be electrically isolated from each other by ion implantation or etching with shortcomings inherent to the ion implantation or etching. Moreover, a narrow width of the $p^+$-clad layer for flowing the current therethrough increases resistance including a contact resistance between the $p^+$-clad layer and an electrode and, as a result, renders the electrode to be sharp enough to cut the electrode in some cases.

SUMMARY OF THE INVENTION

An object of the present invention is to substantially solve at least the above problems and/or disadvantages and to provide additional advantages, by providing an integrated optical device in which optical devices are electrically isolated from each other without ion implantation or etching as in the prior art, and a method of fabricating the integrated optical device.

In one embodiment, an integrated optical device includes a first optical device and a second optical device and integrated on a substrate of a first conductive type, so that the first optical device is optically connected to the second optical device and electrically isolated from the second optical device. Each of the first and second optical devices has an active layer formed into a mesa on the substrate, so that the first and second optical devices share the active layer, a clad layer of a second conductive type formed on the active layer, an SI clad layer formed on the substrate surrounding the sidewalls of the active layer and the clad layer of the second conductive type, and a conductive layer formed into a trench on the SI clad layer for flowing the current in the optical device. The conductive layer is a first conductive layer if the optical device is the first optical device and a second conductive layer if the optical device is the second optical device. The first and second conductive layers are electrically isolated from each other by the SI clad layer.

It is preferred that the first and second conductive layers are dopant diffusion layers of the second conductive type and a dopant diffusion barrier layer is further formed in the SI clad layer for preventing the diffusion of a dopant of the second conductive type under the active layer.

In the integrated optical device fabricating method, to fabricate an integrated optical device having optically connected and electrically isolated first and second optical devices on a substrate of a first conductive type, an active layer and a clad layer of a second conductive type are formed in a mesa structure on the substrate, an SI clad layer is formed on the substrate surrounding the clad layer of the second conductive type and the active layer, and first and second conductive layers are formed into trenches by diffusing a dopant of the second conductive type into the SI clad layer in areas corresponding to the first and second optical devices.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. For the purposes of clarity and simplicity, well-known functions or constructions are not described in detail as they would obscure the invention in unnecessary detail.

Figure 1:
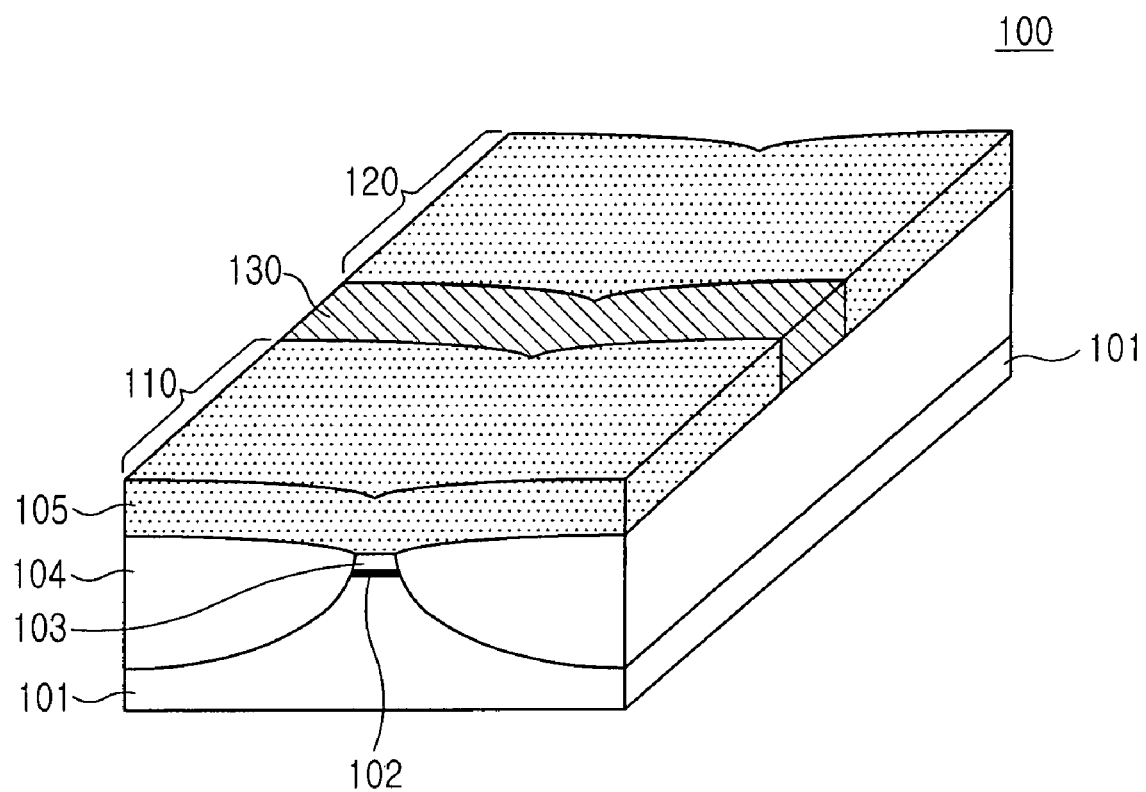
FIG. 1 illustrates the structure of a conventional PBH integrated optical device.
Figure 2:
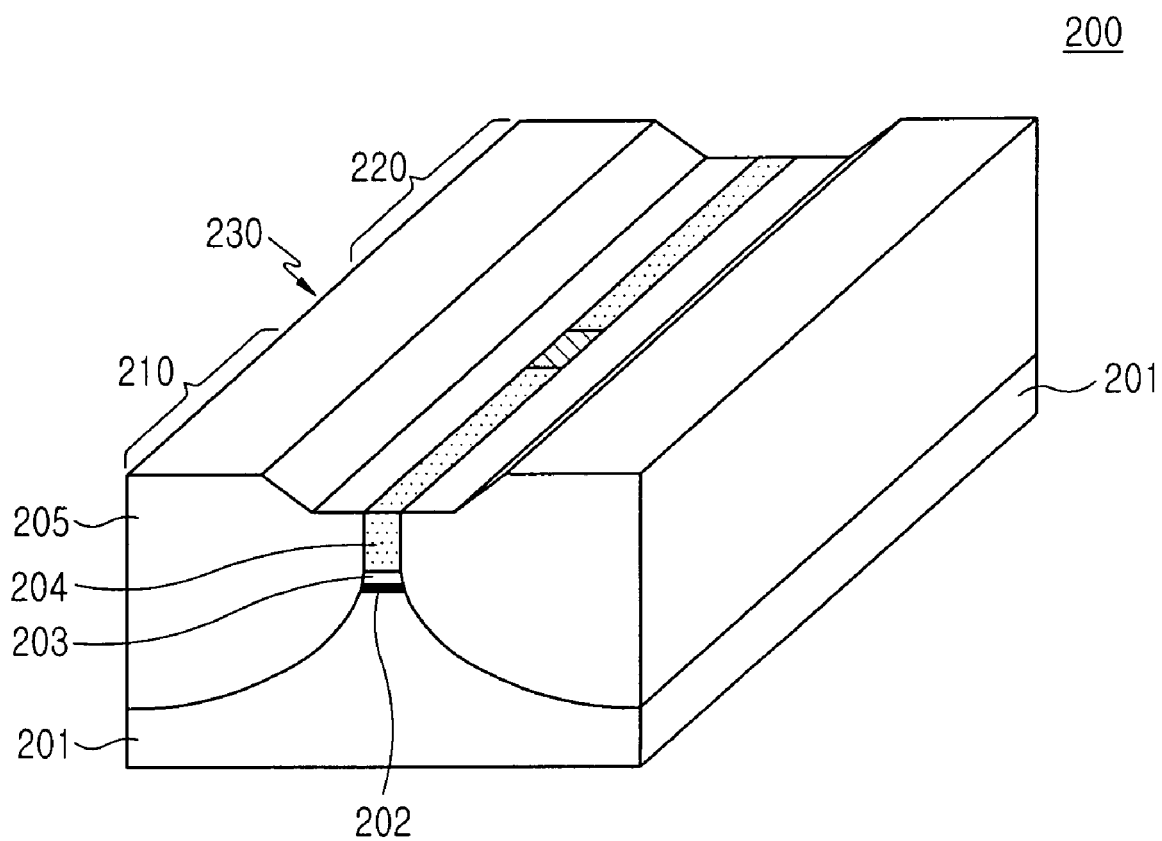
FIG. 2 illustrates the structure of a conventional EMBH integrated optical device.
Figure 3:
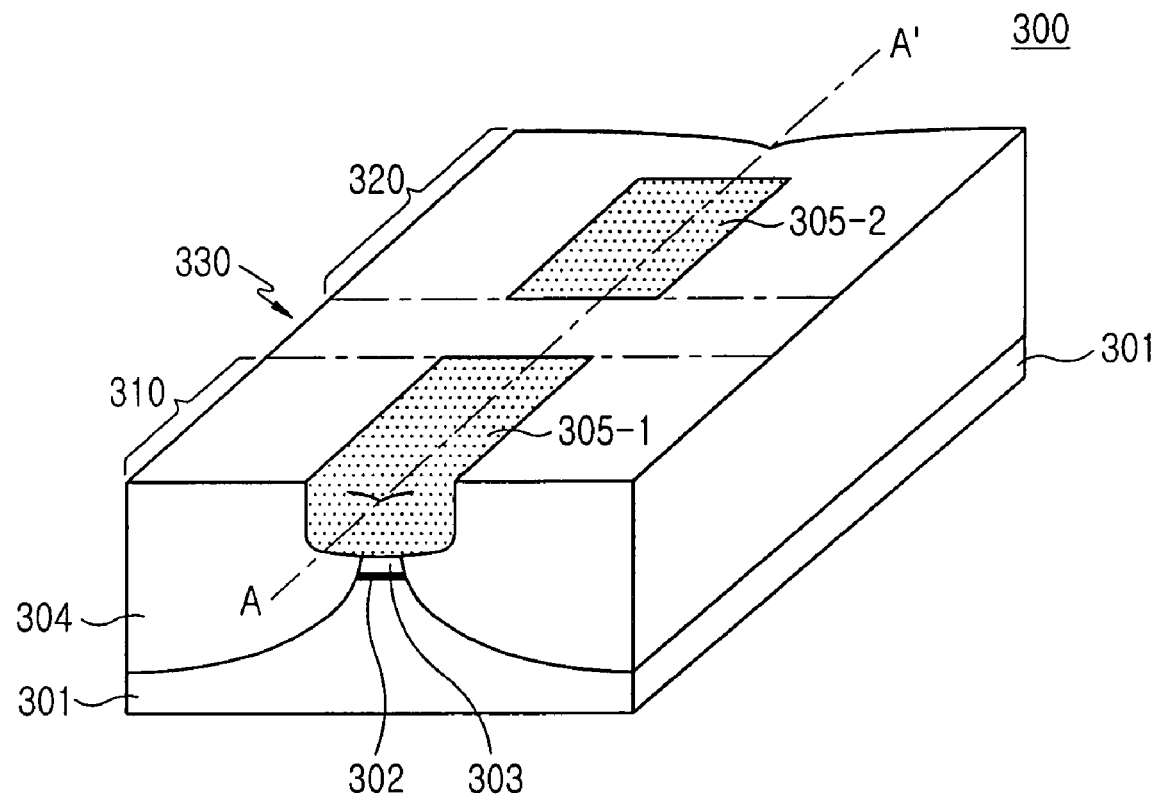
FIG. 3 is a schematic view illustrating the structure of an integrated optical device according to an embodiment of the present invention.

FIG. 3 schematically illustrates the structure of an integrated optical device 300 according to a preferred embodiment of the present invention. As shown, the integrated optical device 300 includes a first optical device 310, a second optical device 320, and an electrical isolation area 330 defining an electrical isolation therebetween, which are all integrated on an n-semiconductor substrate 301. In the embodiment, the first optical device 310 is a DFB LD, and the second optical device 320 is an electro-absorption optical modulator.

Material layers of the first and second optical devices 310 and 320 are deposited on the n-semiconductor substrate 301 and an active layer 302 so that they can be optically connected to each other. A p-clad layer 303 is deposited on the active layer 302, and an SI clad layer 304 is formed so that it surrounds the sidewalls of the mesa-shaped active layer 302 and the p-clad layer 303. An undoped clad layer may substitute for the SI clad layer 304.

First and second conductive layers 305-1 and 305-2 are formed into trenches from the upper surface of the SI clad layer 304 in order to provide current flow in the first and second optical devices 310 and 320, respectively. The formation of the first and second conductive layers 305-1 and 305-2 is carried out by diffusion of p-type impurities. The first and second conductive layers 305-1 and 305-2 are electrically isolated from each other by the SI clad layer 304.

Figure 4:
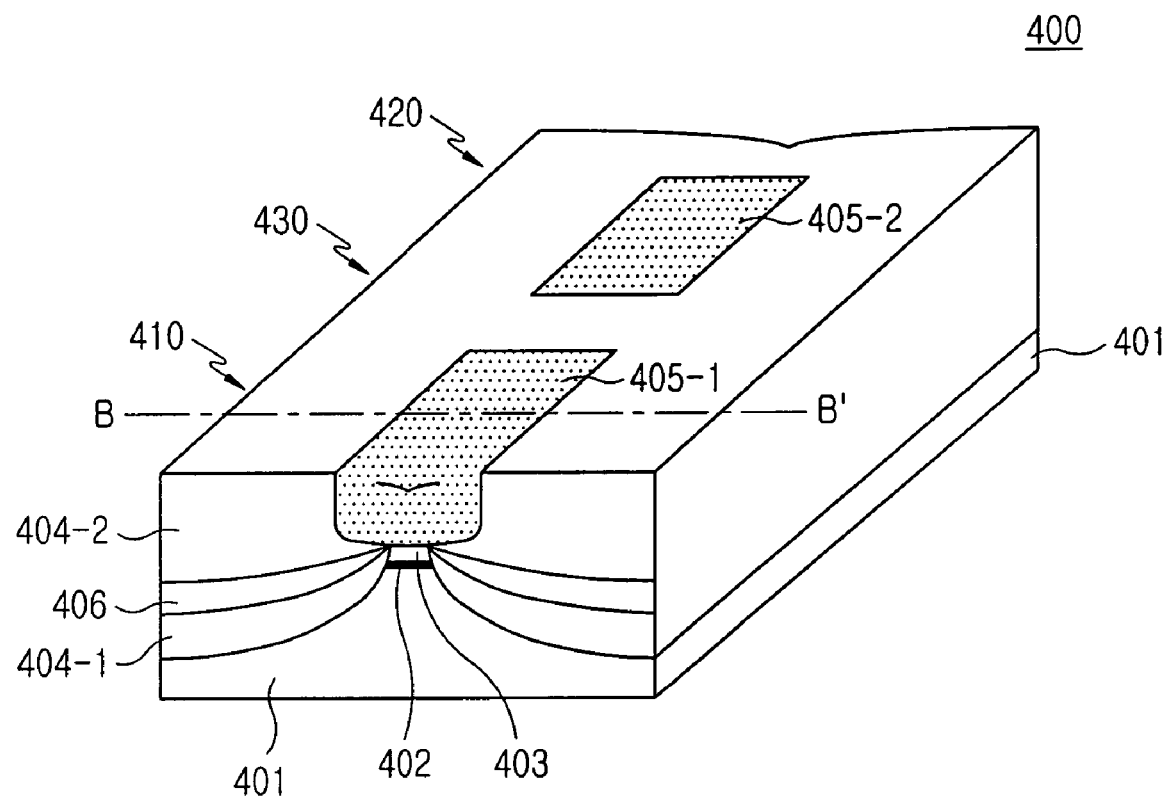
FIG. 4 is a schematic view illustrating the structure of an integrated optical device according to another embodiment of the present invention.

FIG. 4 schematically illustrates the structure of an integrated optical device 400 according to another preferred embodiment of the present invention. As shown, the integrated optical device 400 includes a first optical device 410, a second optical device 420, and an electrical isolation area 430 for providing an electrical isolation therebetween, which are all integrated on an n-semiconductor substrate 401. In FIG. 4, reference numeral 403 denotes a p-clad layer. The integrated optical device 400 has the same configuration as the integrated optical device 300 illustrated in FIG. 3, except for a p-type dopant diffusion barrier layer 406 between SI clad layers 404-1 and 404-2. Therefore, to avoid redundancy, only the dopant diffusion barrier layer 406 will be explained.

The p-type dopant diffusion barrier layer 406 is formed between the first SI clad layer 404-1 and the second SI clad layer 404-2 to prevent the diffusion of a p-type dopant under an active layer 402 during the diffusion of the p-type dopant to form the first and second conductive layers 405-1 and 405-2. An n-type clad layer or a third SI clad layer can be used as the dopant diffusion barrier layer 406. Here, the third SI clad layer is resistant to the diffusion of a p-type dopant, unlike the first and second SI clad layers 404-1 and 404-2. The third SI clad layer assumes this property by adding an SI material with a transition metal such as Co, Ni, Ru, Rh, Pd, Os, Ir or Pt, a lanthanide series element such as La, Ce, or PR, or an actinium series element such as Ac, Th or Pa.

Figure 5:
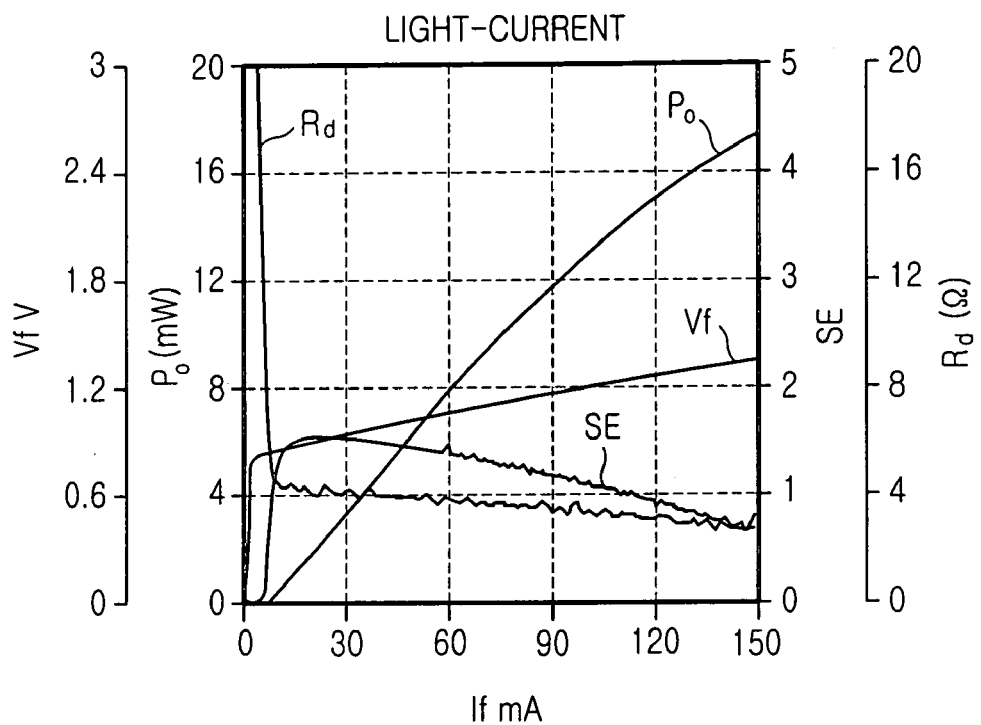
FIG. 5 is a graph illustrating the characteristics of an integrated optical device having a laser diode therein according to the present invention.

FIG. 5 is a graph illustrating the characteristics of an integrated optical device having a laser diode therein according to the present invention discussed above. A horizontal axis represents current (I) and a vertical axis represents voltage (V), optical power ($P_o$), laser efficiency (SE) and resistance ($R_d$). An oscillation start current (Ith) of the laser is 6.71 mA, approximate to that of the conventional laser, 10 mA.

Figure 6:
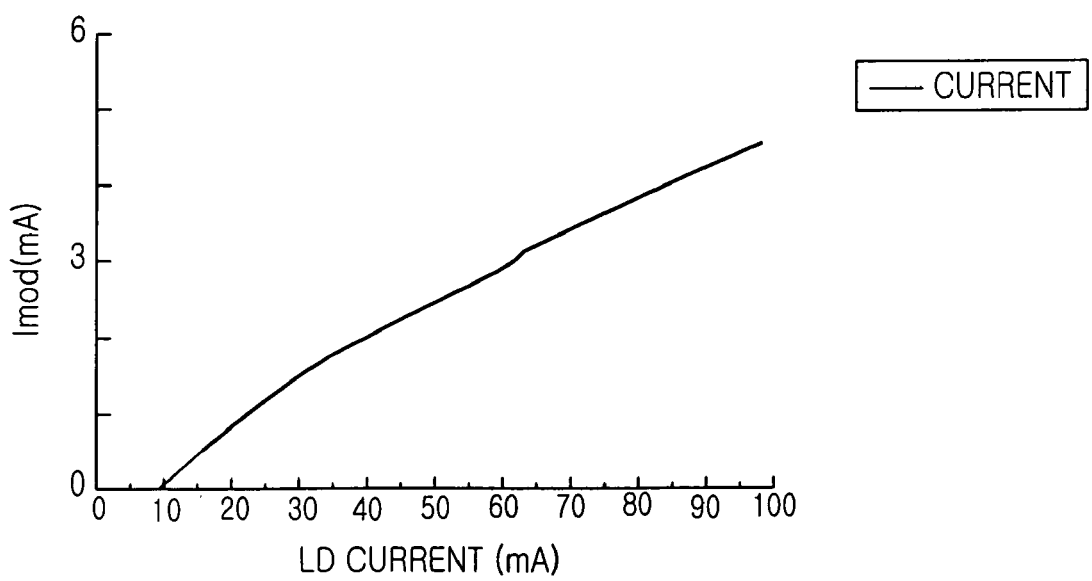
FIG. 6 is a graph illustrating the intensity of current (Imod) measured at a second optical device, a modulator with respect to current (LD current) flowing in a first optical device, a laser diode according to the present invention.

FIG. 6 is a graph illustrating the current intensity (Imod) measured at the second optical device, the modulator with respect to current (LD current) flowing through the first optical device, and the laser diode. As shown, as LD current increases, Imod also increases, which implies that light emitted from the laser diode is introduced into the modulator. Table 1 below illustrates data relating to the electrical isolation between adjacent optical devices according to the prior art and present invention.

TABLE 1

| Distance between devices | Conventional PBH structure (isolation by etching) | Present invention |
|---|---|---|
| 10 μm | 10 Ω | 20–30 kΩ |
| 20 μm | 20 kΩ | 0.8–1 MΩ |

Now, a process of fabricating the integrated optical device 400 illustrated in FIG. 4 is explained in sequence with reference to FIGS. 7A through 7D.

Figure 7A:
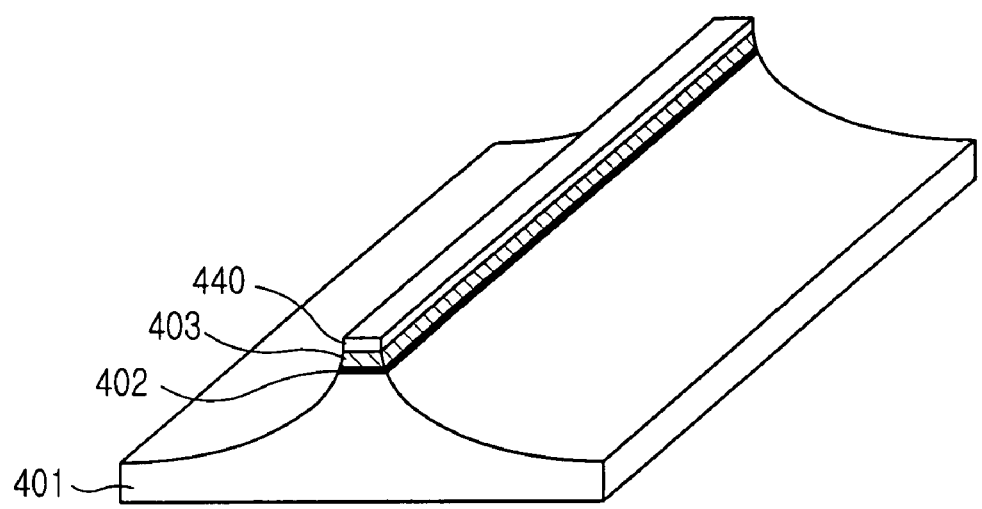
FIGS. 7A to 7D sequentially illustrate a method of fabricating the integrated optical device illustrated in FIG. 4.

Referring to FIG. 7A, after the active layer 402 and the p-clad layer 403 are sequentially deposited on the n-semiconductor substrate 401, they are shaped into a mesa by etching them using an SiO₂ mask 440. The total etched thickness of the p-clad layer 403, the active layer 402, and the n-semiconductor substrate 401 is, for example, 3 μm.

Figure 7B:
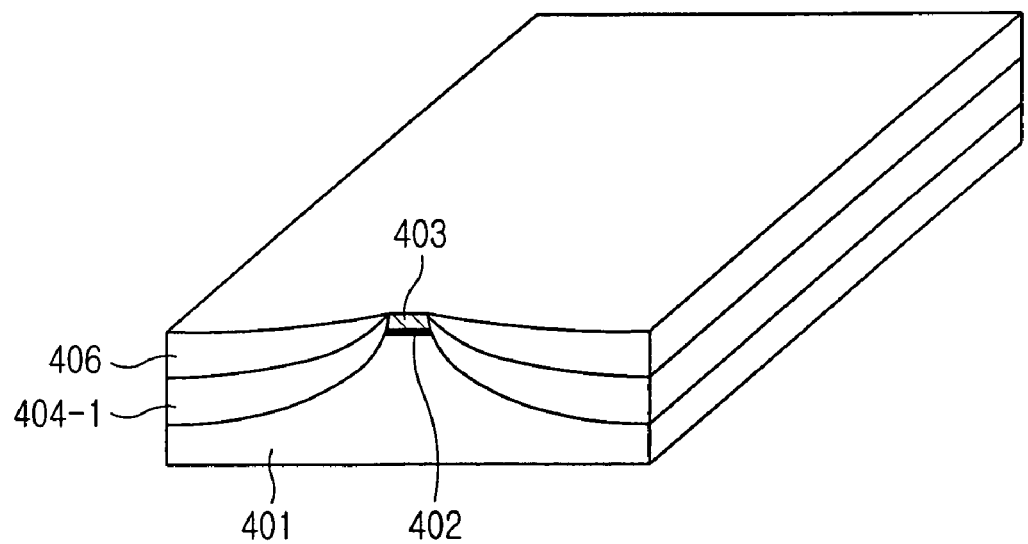

Referring to FIG. 7B, the SI clad layer 404-1 and the n-clad layer 406 are grown over the mesa and planarized. Then, the SiO₂ mask 440 is removed. The n-clad layer 406 functions to prevent the diffusion of a p-type dopant under the active layer 402 during diffusion. The n-clad layer 406 can be replaced by an undoped clad layer or an SI clad layer resistant to p-type dopant diffusion.

Figure 7C:
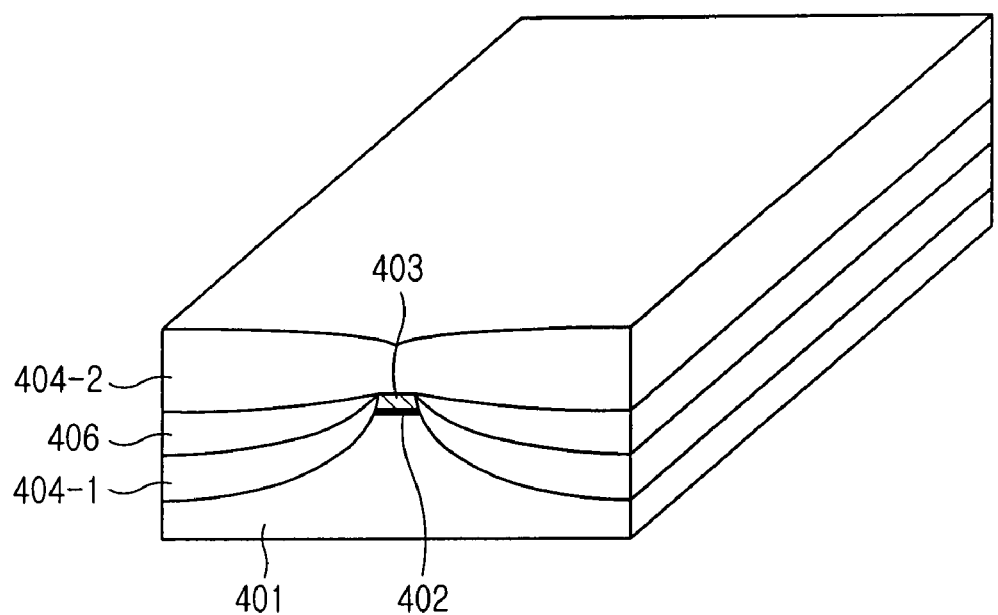

Referring to FIG. 7C, the SI clad later 404-2 is formed on the overall surface of the planarized structure.

Figure 7D:
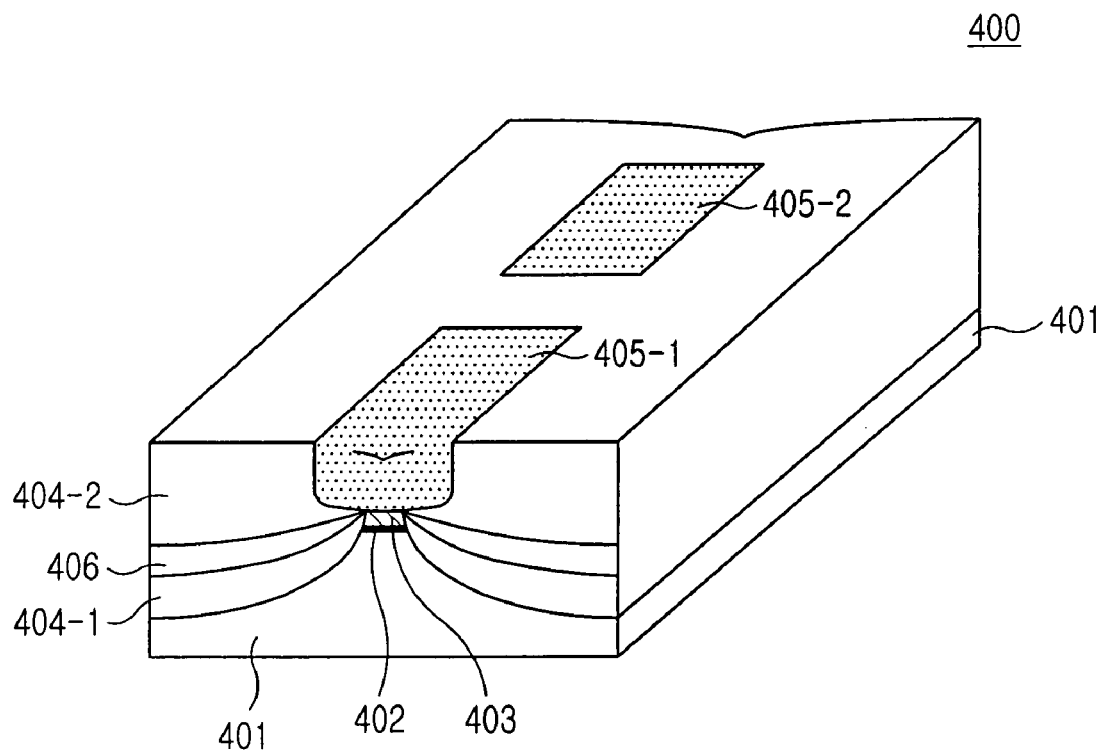

Referring to FIG. 7D, predetermined areas for forming the first and second conductive layers 405-1 and 405-2 are exposed using a mask pattern (not shown) on the SI clad layer 404-2. A p-type dopant is doped on the exposed areas by evaporation or sputtering and heated for a predetermined time, so that the p-type dopant is diffused into the SI clad layer 404-2. Diffusion time and temperature are selectively controlled so that the dopant is diffused onto the active layer 402. The p-type dopant can be Be, Mg, Zn, Cd or Hg.

As described above, the inventive integrated optical device is fabricated by forming a semiconductor layer having an electrical isolation property over devices and allowing current to flow only through a device requiring current via dopant diffusion. Therefore, the fabrication process is simplified compared to the prior art. Furthermore, since there is no distortion or damage in an active layer, which is encountered with etching or ion implantation, optical transmission characteristics can be improved according to the present invention.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An integrated optical device comprising:

a first optical device and a second optical device integrated on a substrate;

an active layer formed into a mesa on the substrate for optically coupling the first and second optical devices;

a clad layer formed on the active layer;

a semi-insulating (SI) clad layer formed on the substrate and surrounding the sidewalls of the active layer and the clad layer for electrically isolating the first and second optical devices; and a first conductive layer and a second conductive layer formed into a trench on an upper surface of the SI clad layer and electrically isolated from each other by the SI clad layer for allowing current flow in the first and second optical devices.

2. The integrated optical device of claim 1, wherein the first and second conductive layers are dopant diffusion layers.

3. The integrated optical device of claim 2, further comprising a dopant diffusion barrier layer in the SI clad layer for preventing diffusion of a dopant under the active layer.

4. The integrated optical device of claim 3, wherein the dopant diffusion barrier layer is an SI clad layer containing one of a transition metal element, a lanthanide series element, and an actinium series element.

5. The integrated optical device of claim 1, wherein the first optical device is a DFB LD (Distributed-Feedback Laser Diode) and the second optical device is an electro-absorption optical modulator.

* * * * *